(12) United States Patent
Underbrink et al.

(10) Patent No.: US 6,754,287 B2
(45) Date of Patent: Jun. 22, 2004

(54) METHOD AND APPARATUS FOR PRODUCING A MODULATED SIGNAL

(75) Inventors: Paul A. Underbrink, Lake Forest, CA (US); Daryush Shamlou, Laguna Niguel, CA (US); Ricke W. Clark, Irvine, CA (US); Joseph H. Colles, Bonsall, CA (US); Guangming Yin, Foothill Ranch, CA (US); Patrick D. Ryan, Yorba Linda, CA (US); Kelly H. Hale, Dana Point, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 221 days.

(21) Appl. No.: 09/814,196

(22) Filed: Mar. 21, 2001

(65) Prior Publication Data

US 2002/0136326 A1 Sep. 26, 2002

(51) Int. Cl.$^7$ .......................... H04L 27/20; H04L 27/04
(52) U.S. Cl. ...................... 375/308; 375/279; 375/297; 375/300
(58) Field of Search ................................. 375/261, 268, 375/269, 279, 296, 297, 298, 300, 308; 330/207 A, 251, 43; 332/103, 144, 145, 151, 155, 157; 455/126

(56) References Cited

U.S. PATENT DOCUMENTS

| 4,584,541 A | * | 4/1986 | Nossen .......................... 332/145 |
| 5,450,044 A | | 9/1995 | Hulick | |
| 5,705,959 A | * | 1/1998 | O'Loughlin ................. 332/151 |
| 6,101,224 A | | 8/2000 | Lindoff et al. | |
| 6,194,963 B1 | | 2/2001 | Camp, Jr. et al. | |
| 6,369,648 B1 | * | 4/2002 | Kirkman ....................... 330/43 |
| 6,480,704 B1 | * | 11/2002 | Pakonen ..................... 455/126 |

FOREIGN PATENT DOCUMENTS

| EP | 1170915 A1 | * | 1/2002 | ........... H04L/27/20 |
| JP | 2000-286915 A | * | 10/2000 | ........... H04L/27/36 |

OTHER PUBLICATIONS

PCT International Search Report as issued in International Application No. PCT/US02/08550, Mailing Date Jul. 15, 2002.

* cited by examiner

Primary Examiner—Chieh M. Fan
(74) Attorney, Agent, or Firm—Weide & Miller, Ltd.

(57) ABSTRACT

Communications systems, and particularly portable personal communications systems, such as portable phones, are becoming increasingly digital. One area that has remained largely analog, however, is the modulation and RF amplifier circuits. To produce a RF frequency waveform. An output of a class D amplifier is coupled to an integrator to create an analog signal. A resonant circuit shapes an output waveform based on the analog signal to create a sinusoidal RF broadcast signal. The waveform of the class D amplifier may be duty cycle modulated. Digital modulation may occur using a digital sigma delta modulator or a digital programmable divide modulator. Using the digital modulation techniques and class D amplification techniques together allows for broadcast a PSK signal that has been decomposed into amplitude and phase components.

18 Claims, 9 Drawing Sheets

METHOD AND APPARATUS FOR PRODUCING A MODULATED SIGNAL

BACKGROUND OF THE INVENTION

1. Field of the Invention

This invention relates to electronic communication devices operating in a digital mode that reduce power dissipation.

2. Related Art

Portable electronic devices have become part of many aspects of personal, business, and recreational activities and tasks. The popularity of various portable personal electronic communications systems, such as portable phones, portable televisions, and personal pagers, is continually increasing. As the popularity of portable electronic systems increases, so does the demand for smaller, lighter, more powerful and more power efficient devices.

Amplification and processing of electronic signals is a function performed in many portable electronic systems. Amplification circuitry and semiconductor devices tend to generate significant amounts of heat and consume significant amounts of power. The continually shrinking packaging, containing the amplification circuitry and devices, has tended to reduce the ability of these devices to dissipate heat through convection. The space surrounding these devices has become significantly more confined as packaging sizes shrink, thereby reducing the opportunity for convection currents to circulate and remove heat. In addition the packaging for these smaller, lighter electronics devices is being made, in significant part, of materials such as plastics, that are generally lighter than metal packaging. Plastics, relative to metals, however, generally tend to have a greater thermal resistance to heat transfer. The opportunity for heat transfer, and the cooling of the power circuitry via conduction, may be significantly reduced by the increasing use of non metallic materials.

Reliability of a semiconductor device is generally directly related to the operating temperature of the device, as well as the change in temperature the device undergoes during it's period of operation. For these and other reasons, manufacturers of portable electronic systems have sought to reduce power consumption of devices within their systems. By reducing the power consumption within their systems, the amount of heat generated is reduced and reliability is increased.

A benefit of reduced power consumption, in addition to increased reliability due to reduced temperature, is an increase in operational time. Because portable electronic devices are commonly battery powered, a reduction in power consumption may translate into a longer battery life and more time between recharges or battery changes.

One method of reducing power consumption is to employ digital designs. Digital communications systems are, in large part, replacing analog communication systems. One reason, that digital techniques have exhibited a rising popularity over analog systems is that digital systems may offer increased performance and lower overall power consumption than analog systems. Another reason that digital systems are increasingly popular is that digital systems generally may dissipate less power than their analog counterparts, in accomplishing the same functions. Digital systems may dissipate less power than analog systems because digital systems operate using two distinct values, often called ones and zeros. These values are generally created by semiconductors that are in the saturated state or the cut off state. In the saturation state, there is current flowing through the device, but the voltage across the device is low. Power dissipated in an electronic device is, for the most part, equal to the voltage across the device multiplied by the current flowing through it. The power dissipated by a device in the saturation state is the amount of current flowing through the device multiplied times a low saturation voltage. Because the saturation voltage of a semiconductor device is typically low, the power that is equal to the voltage times the current is also typically low. In the cut off state of a semiconductor device, the voltage across the device is usually at a maximum. In the cut off state the current through the device, however is typically low and is commonly zero or a low leakage current. Because the current is low in the cutoff state, the power that is represented by the current times the voltage is also typically low. Digital circuits are typically in either a cutoff or saturation state during operation, except for the times when they are switching between states. By contrast, analog circuits generally operate between the cutoff region and the saturation region, in an area commonly referred to as the active region. Devices that operate in the active region, generally have significant voltage levels across them and concurrently have significant current flowing through them. The concurrent presence of significant voltage and significant current, in a device that is operating in the active region, generally signifies that the product of the current and voltage, i.e. the power dissipated in the device, will also be significant. Devices, that operate in an analog mode tend to inherently dissipate more power than devices that operate in an digital mode. Thus, designers of power sensitive systems often employ digital circuits, if possible, as one method of saving power.

The first portable telephones created were analog systems. They tended to be large and require significant power sources. As portable designs continued to evolve, more and more phones were designed with an increasing number of digital circuits. While significant progress has been made in eliminating analog circuitry within phones, the conversion to digital circuits has not been 100% complete. There are still circuits that are analog or have significant analog components. In order to attempt further power savings manufacturers are continuing to attempt to replace analog sub systems with more efficient digital subsystems.

SUMMARY

Power amplifiers, as used in portable communication devices, are commonly analog circuits that consume significant amounts of power. One embodiment of the invention employs a class D digital amplifier instead of an analog power amplifier. With a class D digital amplifier, a modification of the power output is achieved by changing the duty cycle of the amplifier. In this way the amplifier's output may be changed depending on the output power requirement of the amplifier.

Portable communication devices typically have a significant amount of analog circuitry in for modulation. The modulation circuitry incorporates oscillators and linear phase shift circuits to accomplish signal modulation. This invention also employs a digital version of a phase shift modulator for providing phase shift keying modulation. Phase shift keying modulation within portable phones is often provided with circuitry containing a significant number analog elements.

A programmable divide modulator may be used to provide digital phase shift keying modulation. The programmable divide modulator is used, in the third embodiment, to replace circuitry containing analog elements. Because the improvements disclosed in the illustrated embodiments are primarily digital, power consumption may be reduced and reliability enhanced, compared with higher power consuming analog versions.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. Moreover, in the figures, like reference numerals designate corresponding parts throughout the different views.

DETAILED DESCRIPTION

Embodiments of the invention relate, generally, to power dissipation within communications devices, and in particular embodiments to power dissipation within personal portable communication systems. Communication systems may be employed in a variety of portable electronic devices. Communication systems typically include one or more portable units that transmit and/or receive from one or more remotely located transmitter and/or receivers. In many portable communications applications it is desirable to reduce the power dissipation within the internal electronics. Reducing power dissipation may increase the reliability of the electronic device.

In a Phase Shift Keying (PSK) modulation process, the transmitted information is contained in the phase of the transmitted signal. In other words, the phase of a PSK signal changes depending on the information to be conveyed. Multiple variants of phase shift keying are commonly used to convey information in wireless communication devices.

Figure 1:
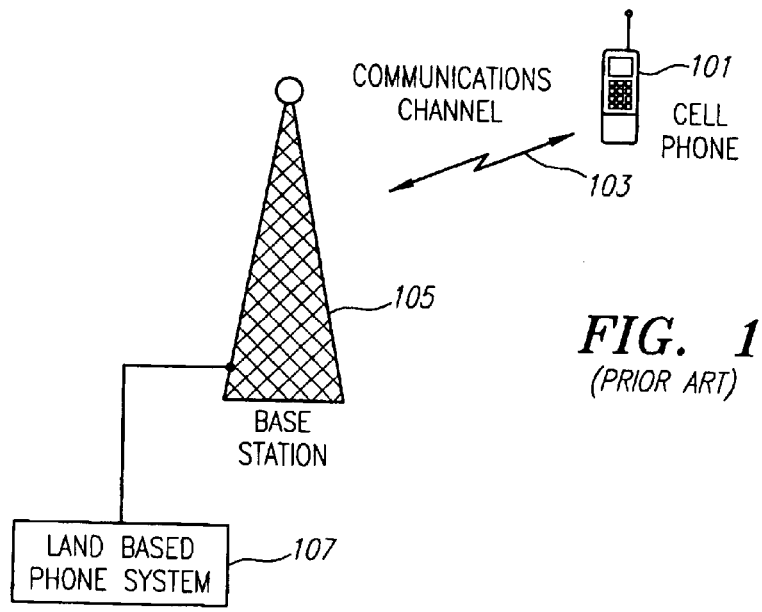
FIG. 1 is a Prior Art block diagram representing a system environment in which embodiments of the invention may be used.

FIG. 1 is a Prior Art block diagram illustrating a system environment used with example embodiments of the invention. In FIG. 1, a wireless communication device 101 communicates, using a communications channel 103, with a base station 105. The base station 105 couples the communications from the wireless communication device into the land based phone system 107.

Figure 2:
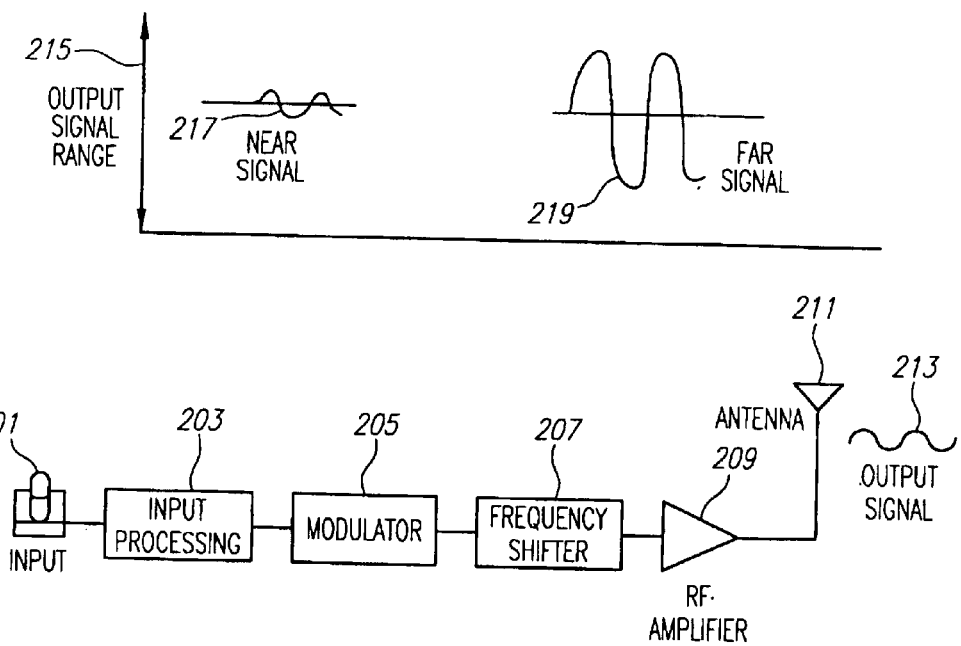
FIG. 2 is a Prior Art block diagram of the transmit portion of a portable phone showing the output signal when the phone is near a base station contrasted with the output of a distant portable communication device.

FIG. 2 is a block diagram containing an illustration of the transmit portion of a wireless communication device. The device may have a microphone input 201 for the inputting a user's voice. The microphone input 201 may convert the sound waves of the user's voice to an electrical signal, for processing in the input processing block 203. The signal is processed in the input processing block 203 and then is sent to the modulator 205, where the signal combines with a carrier signal. The modulated signal is then sent to a frequency shifter 207, that increases the frequency of the modulated signal to the broadcast frequency of the device, thus creating a broadcast frequency signal. The broadcast frequency signal is then sent to an RF amplifier 209, where it is amplified and then sent to an antenna 211 for broadcast as an output signal 213.

The amplitude of the broadcast signal will vary depending on whether the wireless communication device 101 is far from or near to the base station 105. If the device 101 is near to the base station a near signal 217, that is a comparatively low amplitude signal when compared with the output signal Range 215 is generated. If the device 101 is farther from the base station, a far signal 219 is generated. The far signal 219 is of a comparatively higher amplitude signal than the near signal 217.

Changing the amplitude of the output signal, depending on the distance of the phone from the base station, is advantageous for several reasons. One reason is that power may be conserved, when the device 101 is relatively near the base station 105. When the device 101 is relatively near the base station 105 it takes less power to create a readable signal at the base station 105 than if the device 101 were farther away. Applying the same amount of power, to a transmitted signal, whether the base station is nearby or farther away, would waste the limited battery energy within the device. In addition wireless communication devices may change their power so that the signal arriving at the base station, from the device, is relatively constant, regardless of the distance of the device is from the base station. Because the transmitted signals are arriving at the base station with similar power levels, it is easier for the base station to process the incoming signals.

Digital Output Power Adjustment and Amplitude Modulation

A RF power amplifier within a wireless communication device is an analog type amplifier, such as a class A type amplifier. Class A amplifiers typically have a quiescent current, even when no signal is being output. Class A amplifiers are commonly known for both inefficiency and linearity. Linearity is often a trade off with power dissipation. This trade off is especially true in the case of the class A amplifiers, that dissipate a significant amount of power, as compared with their output power. Another characteristic of class A amplifiers is that they are easily controllable to vary their output.

Another type of amplifier is a class D amplifier. Class D amplifiers operate by switching between saturation and cutoff. When the amplifier is in a saturation mode, the current in the output of the amplifier is at a maximum. However, because the output is saturated, there is little voltage developed at the output. Because of the low voltage across the output, the power dissipated is minimal. When the amplifier is in the cut off mode, the output of the amplifier is at a maximum voltage, but the current through the output is a small value, typically a leakage current or zero. The class D amplifier typically varies between full on (saturation) and full off (cutoff).

Figure 3:
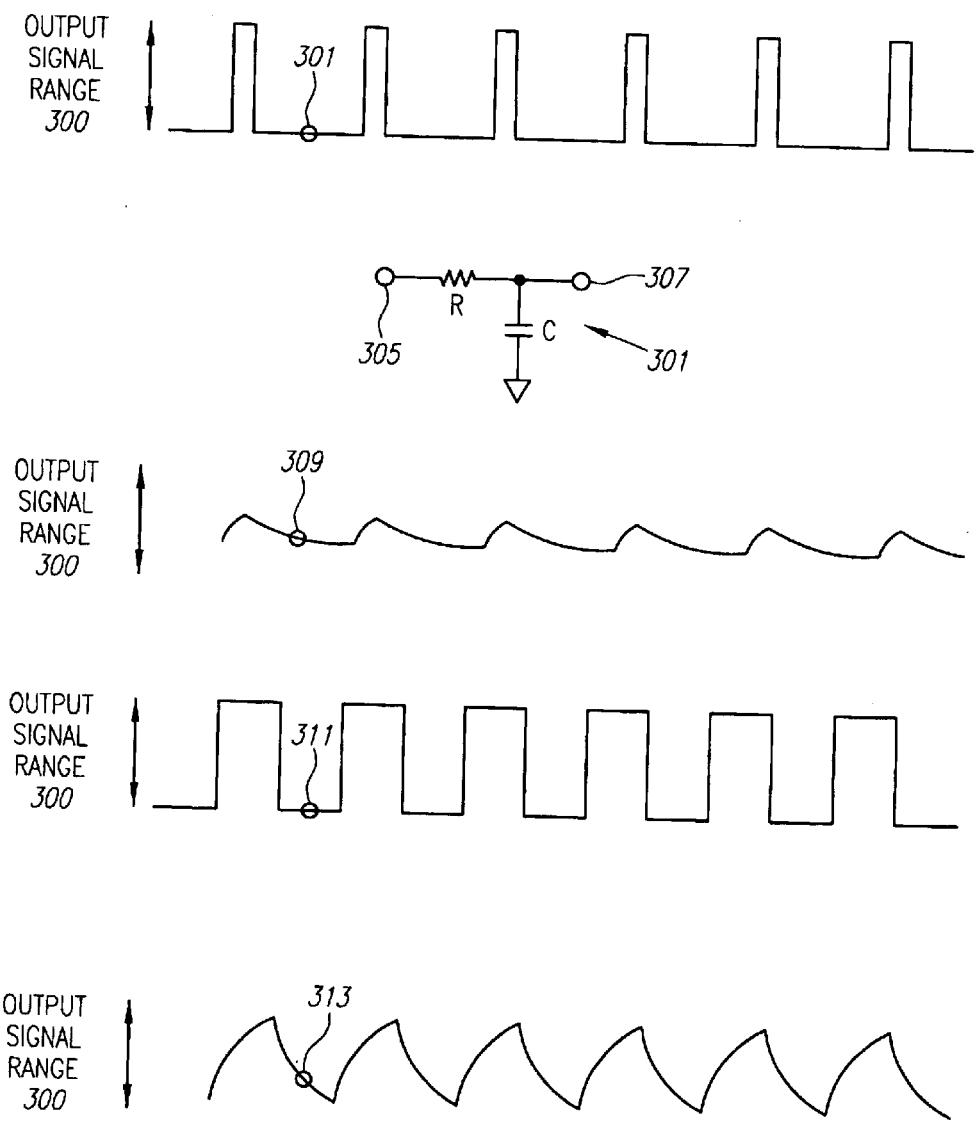
FIG. 3 is a graphical illustration of how a class D amplifier may generate the "near" and "far" signals.

FIG. 3 is a graphical illustration of how a class D amplifier may generate the "near" and "far" signals, of differing amplitude, such as those illustrated in FIG. 2. The waveform 301 in FIG. 3 shows an example of the output of a class D amplifier. The waveform varies between a minimum and a maximum of the Output Signal Range 300. If the waveform 301, is coupled into the input 305, of an integrator circuit 303, then a waveform, such as 309, may be seen at the output 307, of the integrator circuit 303. The amplitude of the signal 309, no longer swings between limits of the output signal range 300. If the duty cycle of the waveform 301 is increased, a waveform such as 311 may be created. If the waveform 311 is coupled into the input 305 of an integrator circuit 303, then a waveform, such as 313, may be seen at the output 307 of the integrator circuit 303. The waveform 313 has a greater amplitude than the waveform 309.

Because the changing of the duty cycle of the class D amplifier results in differing amplitude waveforms, when coupled into the integrator 303, the output generated by the amplifier may be changed. If the output of the class D amplifier is coupled into a pulse shaping network containing a resonant circuit, a waveform approaching a sine wave in shape may be generated. Therefore, by modulating the duty cycle of the Class D amplifier, a variable amplitude waveform may be generated.

Figure 4:
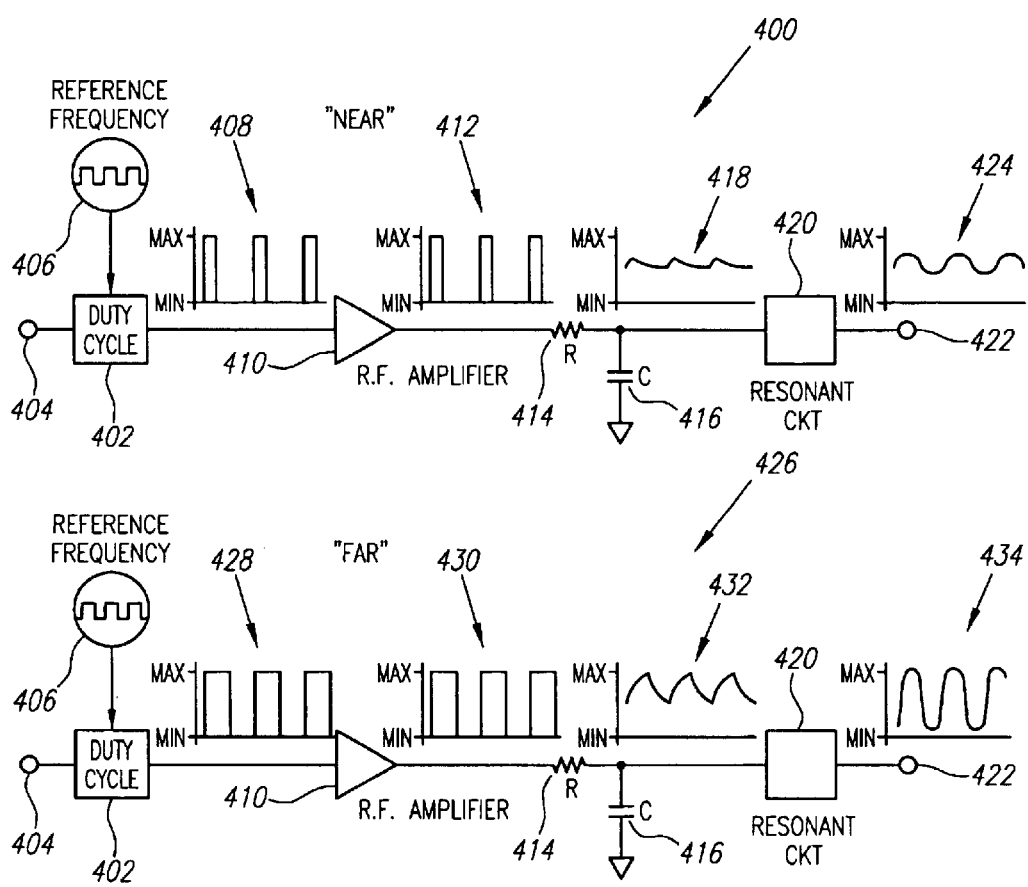
FIG. 4 is a graphical illustration of a conventional representation of binary, as 180° phase shifts, in a Binary Phase Shift Keying ("BPSK") signal.

FIG. 4 depicts a first embodiment where a class D amplifier is arranged to produce Radio Frequency (RF) signals such that the amplitude may be controlled. This type of control may be used in portable communication devices to change power output depending on the distance of the portable phone to a base station receiving its signal. The embodiment illustrates two different output levels for the communication device, termed "near" and "far." They are used to illustrate the principle of changing RF signal output. When the communication device is operating near to the base station, its output signal is represented by the "near" signal that is of lower amplitude than the "far" signal. When the communication device is far from the base station, its output signal is represented by the "far" signal having a greater amplitude than the "near" signal. The two levels, i.e. "near" and "far," are chosen for illustration purposes. In additional embodiments, different levels may be used, depending on the particular scheme implemented.

FIG. 4 is a block diagram illustrating the difference in circuit waveforms in an example RF output stage under "near" and "far" conditions. The "near" condition 400 occurs when the wireless communication device is operating in relatively close proximity to a base station. When the device is operating in the near condition, the duty cycle block 402 receives a control signal 404, signaling that the unit is operating in a "near" condition. The duty cycle block 402 adjusts the duty cycle of a reference frequency 406, so that the duty cycle is, illustratively about 20%. The duty cycle waveform 408 is the result of the adjustment of the duty cycle of the reference frequency to 20%.

The RF amplifier 410 accepts the waveform 408 from the duty cycle 402 and produces waveform 412. Waveform 412 is an amplified copy of waveform 408. The waveform 412 switches between a minimum value, i.e. saturation of the RF amplifier 410 and a maximum value, i.e. the cutoff of the RF amplifier 410. The output of the RF amplifier 410 may be coupled into an RC circuit consisting of the resistor 414 and the capacitor 416.

The waveform at the junction of 414 and 416 is shown in graph 418. The waveform 418 has an excursion, illustratively of about 20% of the difference between its minimum and maximum value. The waveform at the junction of 414 and 416 is further coupled into the resonant circuit 420. The resonant circuit is tuned to the frequency of the reference frequency 406. The output 422 of the resonant circuit 420 is a sine wave with an excursion, illustratively of about 20% of the difference between its minimum and maximum value, as shown in graph 424. The output 422 of the output stage RF circuit for the "near" case may be chosen to be adequate in the case where the wireless communication device is near the base station.

The "far" condition 426 occurs when the wireless communication device, of the illustrated embodiment, is operating relatively far from a base station. When the device is operating in the far condition, the duty cycle block 402 receives a control signal 404, signaling that the unit is operating in a "far" condition. The duty cycle block 402 adjusts the duty cycle of a reference frequency 406, so that the duty cycle is, illustratively about 40%. The duty cycle waveform 428 is the result of the adjustment of the duty cycle of the reference frequency approximately 40%.

The RF amplifier 410 receives the waveform 428 from the duty cycle block 402 and produces waveform 430. Waveform 430 is an amplified copy of waveform 428. The waveform 430 switches between a minimum value, i.e. saturation of the RF amplifier 410 and a maximum value, i.e. the cutoff of the RF amplifier 410. The output of the RF amplifier 410 is coupled into an RC circuit consisting of the resistor 414 and the capacitor 416.

The waveform at the junction of 414 and 416 is shown in graph 432. The waveform 432 has an excursion of about 40% of the difference between its minimum and maximum value. The waveform at the junction of 414 and 416 is further coupled into the resonant circuit 420. The resonant circuit is tuned to the frequency of the reference frequency 406. The output 422 of the resonant circuit 420 is a sine wave with an excursion of about 50% of the difference between its minimum and maximum value, as shown in graph 434. The output 422 of the output stage RF circuit for the "far" case is chosen to be adequate for the case where the wireless communication device is far from the base station.

In both "near" and "far" cases, the RF amplifier 410 is switching between saturation and cuttoff, so the RF amplifier 410 does not operate in the inefficient Class A mode. In addition, by changing duty cycle the RF output 422, power may be changed to accommodate both the "near" and "far" cases.

Since changing the duty cycle may change the amplitude of the output signal, the duty cycle block 402 may be used to amplitude modulate the output signal. The amplitude modulation of the signal may take place concurrently with the accommodation of the "near" and "far" case as discussed above. For example, in the "near" case, the duty cycle was 20% by using the control signal 404. If the duty cycle of the waveform is varied between 15% and 25%, the "near" signal may be amplitude modulated. In a like manner, in the "far" case, the duty cycle was 40%. By using the control signal 404 to adjust the duty cycle between 35% and 45%, the "far" signal may be amplitude modulated. In the manner described, both the average output power level and the amplitude modulation of the RF signal may be accomplished digitally.

Figure 5:
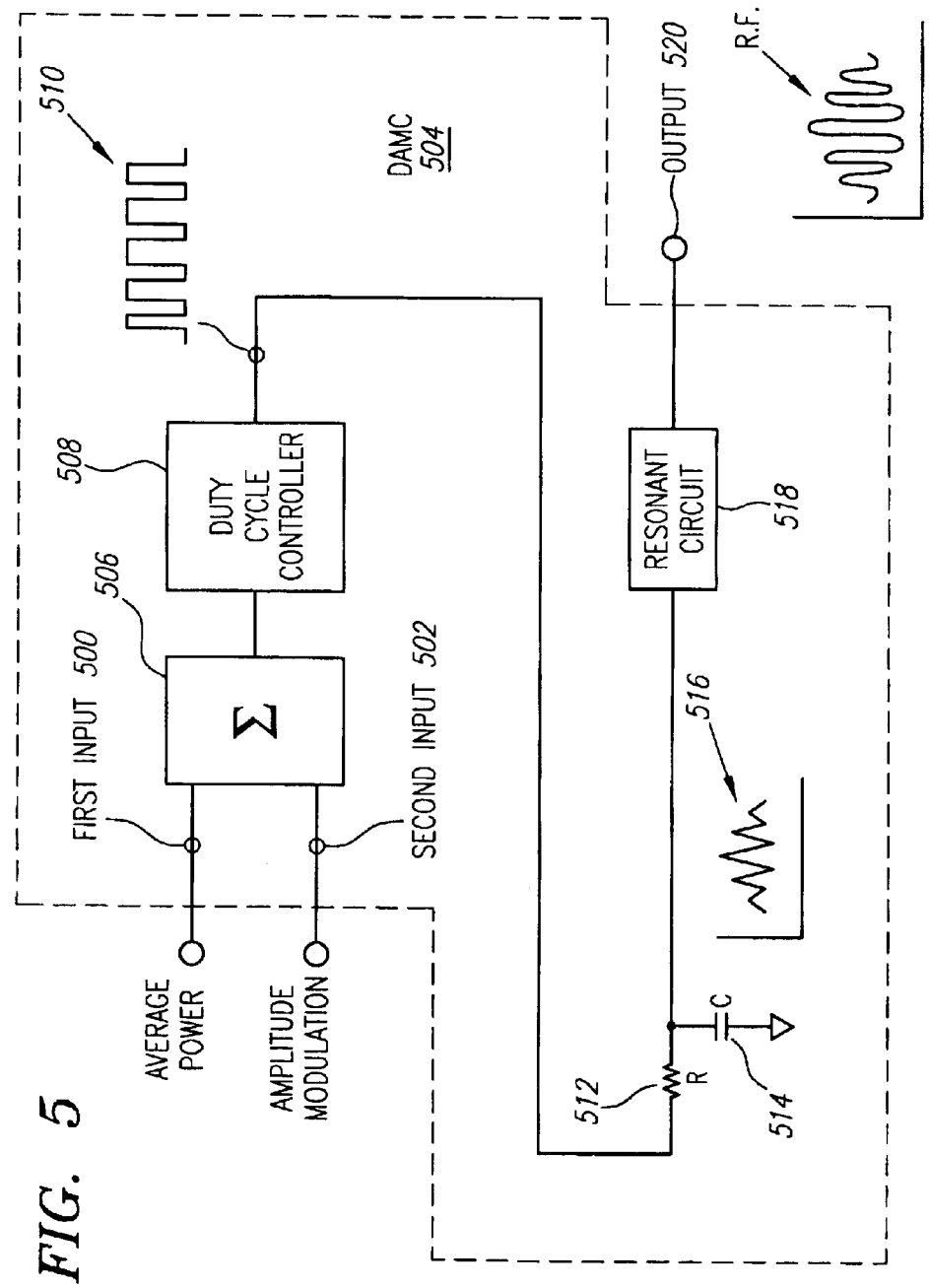
FIG. 5 is a general block diagram of a conventional mechanism for generating BPSK signals.

A digital combination of average power output and amplitude modulation is illustrated in FIG. 5. In FIG. 5, a signal representative of the desired average power is coupled into a first input 500 and is combined with a signal representing the instantaneous desired amplitude modulation coupled into a second input 502 of the Digital Amplitude Modulating Circuit ("DAMC") 504. The desired average power signal coupled into the first input 500 is combined in a summation unit 506, with the desired instantaneous amplitude modulation signal coupled into the second input 502. The output of the summation unit 506, representing the sum of desired average power and the desired instantaneous amplitude modulation, is coupled into the duty cycle controller 508. The resulting signal output from the duty cycle controller 510, represents a signal, the duty cycle of which is dependent on both the average power signal at input 500 and the amplitude modulation signal at input 502. The output signal 510 of the duty cycle controller 508 is coupled into an integrating network comprising resistor R 512 and capacitor C 514. The output of the integrating network, the junction of R 512 and C 514, is a waveform 516 that contains components representative of both the average power signal 500 and the amplitude modulation signal 502. The waveform 516 is then further coupled into a resonant circuit 518.

The output 520 of the resonant circuit 518 is a modulated RF signal having an average power and amplitude modulation that may be controlled digitally. The Digital Amplitude Modulating Circuit ("DAMC") 504 may be a component in a overall digital modulation scheme.

Digital Phase Modulation of Signals

Figure 6:
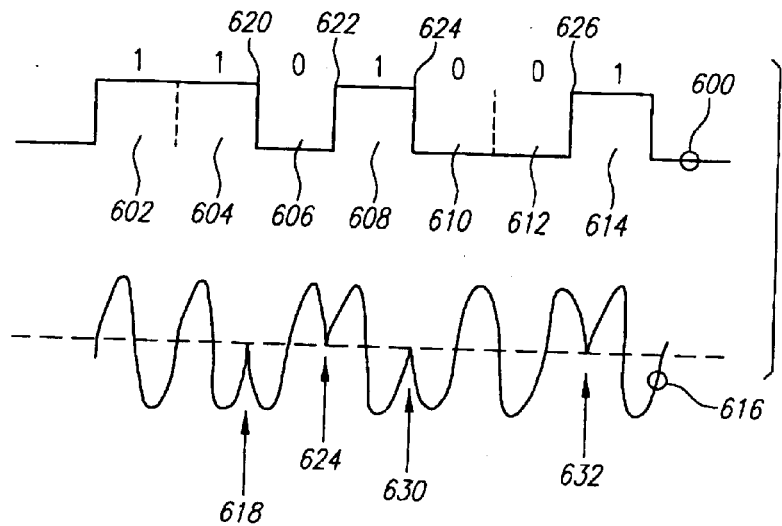
FIG. 6 a graphical representation, often referred to as a constellation, of conventional signal phase and data encoding of a Quadrature Phase Shift Keying ("QPSK") waveform.

Phase Shift Keying ("PSK") is a popular method for modulating a carrier signal with a data signal. In PSK, the phase of a carrier signal, for example a Sine wave, changes depending on whether a data "1" of data "0" transmitted. FIG. 6 illustrates a basic form of phase shift keying commonly known as Binary Phase Shift Keying ("BPSK"). In FIG. 6, waveform 600 represents a digital data signal. In the digital signal 600, a binary "1" is transmitted in time slot 602, a binary "1" is transmitted in time slot 604, a binary "0" is transmitted in time slot 606, a binary "1" is transmitted in time slot 608, a binary "0" is transmitted in time slot 610, a binary "0" is transmitted in time slot 612 and a binary "1" is transmitted in time slot 614. The Binary Phase Shift Keying ("BPSK") signal derived from the waveform 600 is shown as waveform 616. Between time periods 604 and 606, the data changes from a "1" to a "0." This transition is reflected in the 180° phase reversal, as seen at point 618, within the BPSK signal 616. Similarly the data transitions 620, 622, 624 and 626 are reflected as 180° phase reversals at points 618, 628, 630 and 632, within waveform 616, respectively.

Figure 7:
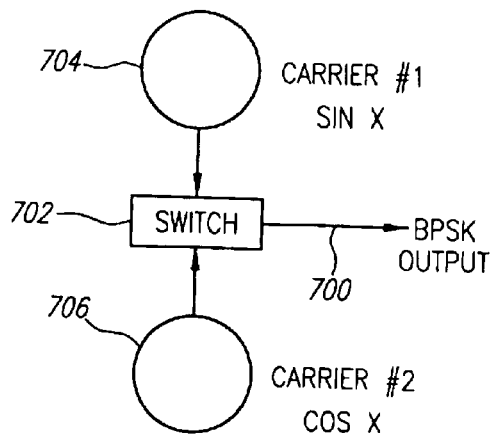
FIG. 7 is a block diagram of a common phase and amplitude alignment scheme for a Phase Shift Keying (PSK) modulated signal.

A BPSK signal may be generated by the mechanism of FIG. 7, where a BPSK output 700 is generated by a switch 702, that selects between a sin(x) carrier 704, and a cos(x) carrier 706. PSK signals may have more than two phases. Quadrature Phase Shift Keying ("QPSK") uses four carrier phases, instead of two carrier phases, to create the modulated signal. In general, a multitude of phases may used create PSK modulated signals. Such multiphase phase shift keying signals are often referred to as Multiple Phase Shift Keying ("MPSK") signals. In addition a signal may have further modulation, such as amplitude modulation, impressed on it. For example, Quadrature Amplitude Modulation ("QAM") uses four carrier phases and two different amplitudes as signal modulation.

Figure 8:
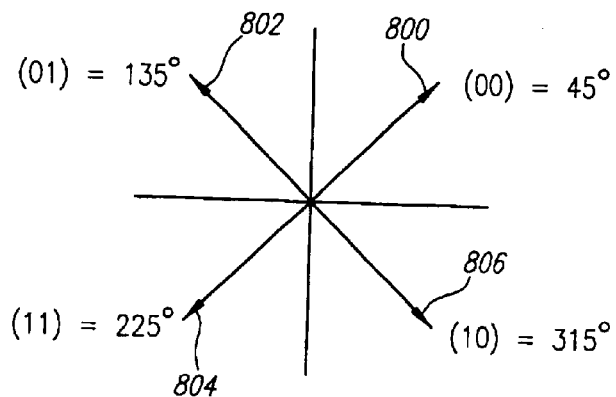
FIG. 8 is a block diagram representation of a quadrature phase shift keying signal separated into amplitude and phase portions.

QPSK modulation is advantageous in that each phase change may be used to encode more than one bit of data. Commonly, in QPSK, a phase change represents two bits of data. The two bits of data encoded within a QPSK signal are commonly portrayed as quadrature vectors, as illustrated in FIG. 8. In FIG. 8, a phase shift of 45°, i.e. vector 800, represents bit pair 00, a phase shift of 135°, i.e. vector 802, represents bit pair 00, a phase shift of 255°, i.e. vector 804, represents bit pair 11, and a phase shift of 315°, i.e. vector 806, represents bit pair 01. These pairs of bits are commonly referred to as dibits or symbols. In general, distinct information states of PSK signals are commonly referred to as symbols. A symbol may be larger than a dibit and may contain several bits of information.

In order to correctly recover binary data encoded using PSK techniques, the phase of the received signal may be compared to a reference signal. This may be accomplished by coupling the received signal into a balanced demodulator and providing a reference signal having a frequency and phase that is approximately identical to the carrier used to modulate the signal. Because of the necessity of providing a signal that has a phase and frequency identical to the carrier signal used in the modulation process, balanced demodulator type circuitry may be complex and expensive. To avoid the requirement of producing a carrier having a frequency and phase that is identical to the carrier used to modulate the signal, differential PSK techniques may be used. In Differential PSK ("DPSK"), there is no absolute phase and, as a result, there is no requirement to provide a carrier with frequency and phase identical to the carrier used to modulate the signal. The binary data is recovered from a DPSK signal by comparing the phase of the signal being received to the phase of the previous symbol received. Comparing a symbol to the previous symbol received, avoids the dependency on an absolute reference.

It is often convenient to refer to phase modulated signals as vectors in the frequency domain rather than the time domain. For the purpose of representing phase modulate signals, I/Q diagrams are often employed instead of the traditional time domain representation. I/Q diagrams commonly depict Q as a vertical axis and I as the horizontal axis. The I axis represents the in-phase part of the signal vector and Q axis represents the quadrature portion of the signal vector. A signal may be represented as a vector rotating in the I/Q plane with the length of the vector representing the amplitude of the signal. Separating a signal into I and Q representation facilitates decomposition of the signal into amplitude and phase components, that may then be used to produce a broadcast signal.

Figure 9:
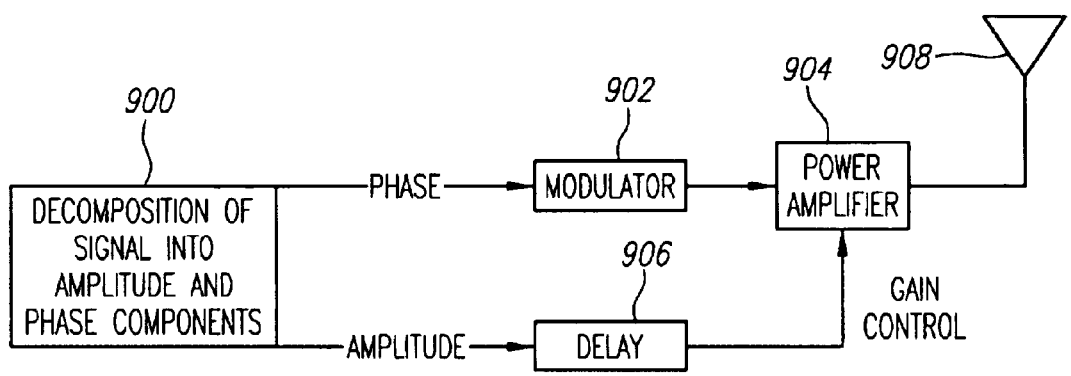
FIG. 9 is a block diagram illustrating the digital combination of average power output and amplitude modulation.

A procedure of using the amplitude and phase components of a signal to produce a PSK modulated broadcast signal is illustrated in the block diagram of FIG. 9. The signal to be encoded is decomposed into phase and amplitude portions in block 900. The phase signal is then typically coupled to a modulator 902, and then into a power amplifier 904. The amplitude signal is coupled to a delay circuit 906. A delay is placed in the amplitude portion of the circuit because the amplitude portion may take longer to propagate through the circuitry than the respective phase information.

The output of the delay 906 is then used to control the amplification of the power amplifier 904. Thus, the amplitude and the phase portions of the signal are recombined, amplified and broadcast by the antenna 908.

A further embodiment of the invention comprises a digital method of phase modulating a signal. Such a method may be used to replace the switching between carriers offset by a given phase, as illustrated in FIG. 7. One embodiment of the digital phase modulator is the sigma delta digital modulator 1000, as illustrated in FIG. 10.

Figure 10:
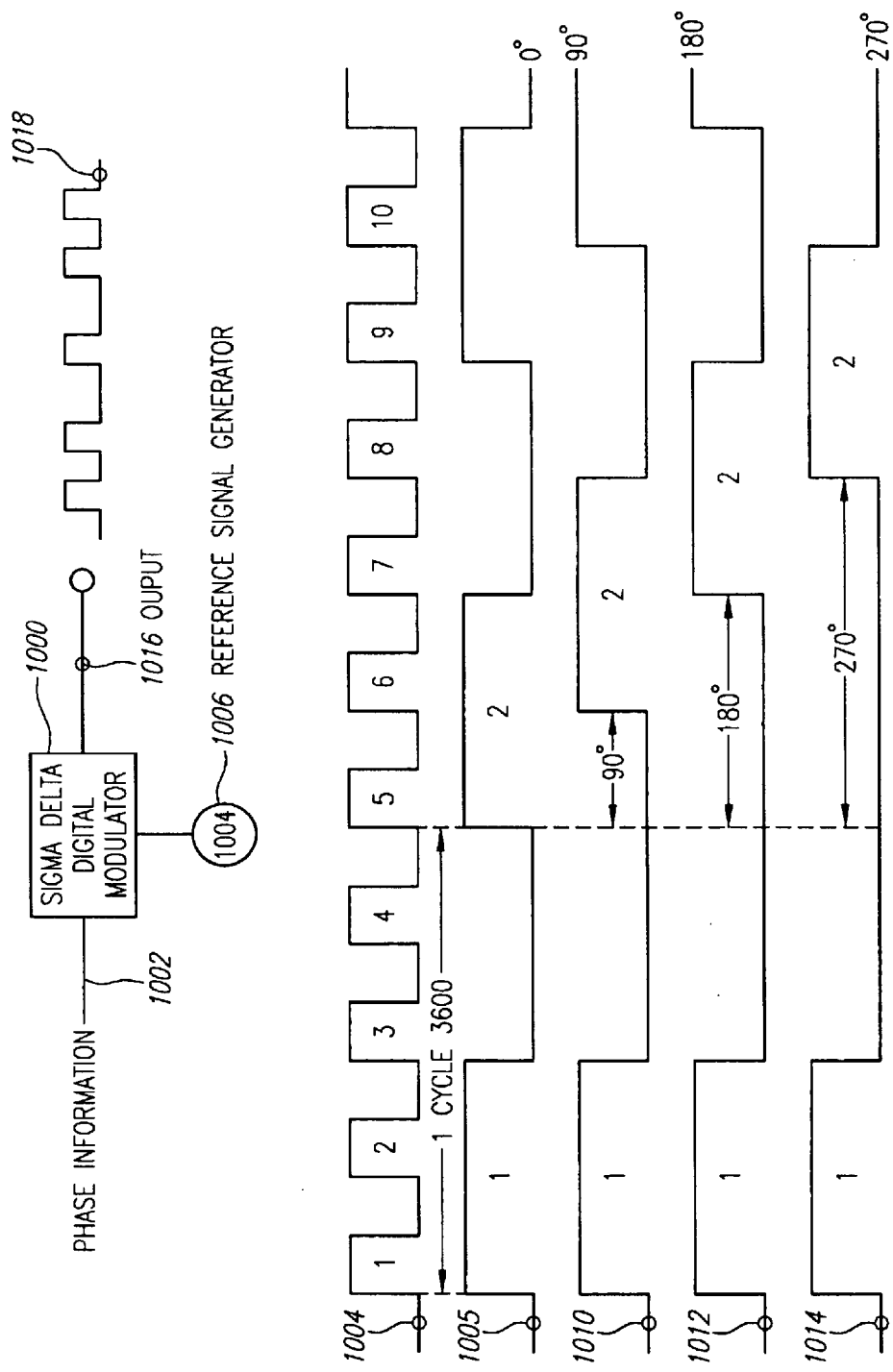
FIG. 10 is a graphical illustration of waveforms and how they may be selected and altered in order to create a digital version of a Delta-Sigma modulator.

FIG. 10 is a graphical illustration of waveforms and how they may be selected and altered in order to create a Sigma-Delta Digital Modulator 1000. Such a modulator may be used in PSK signals such as, but not limited to Binary Phase Shift Keying ("BPSK"), Quadrature Phase Shift Keying ("QPSK"), Offset-Quadrature Phase Shift Keying ("O-QPSK"), and Quadrature Amplitude Modulation ("QAM"). Phase shift keying allows different signal phases to represent different symbols. Each symbol may in turn represent a varying number of bit's of information, depending on how many signals may be represented. In a further embodiment, phase delays may be used to represent the transmitted information.

Phase information 1002 is provided to the Sigma Delta Digital Modulator 1000. The phase information comprises a selection of a 0°, 90°, 180°, or 270° phase shift. The Sigma-Delta Digital Modulator 1000 also accepts a reference signal 1004 provided by a reference signal generator 1006. The reference signal 1004 is several times the frequency of the output signal. In the illustrated embodiment, the reference signal is four times the frequency of the output signal.

The 0° signal is represented by waveform 1008. In waveform 1008, there is no delay between the first cycle of the waveform 1004, and the second cycle of waveform 1008. The waveform 1008 is generated by dividing the waveform 1004 by four, using standard digital techniques. The waveform 1010 is also generated by dividing the waveform 1004 by four, using standard digital techniques, except that the second cycle has been delayed by 90° from the first, when compared with waveform 1008. The second cycle of waveform 1010 is delayed by 90°, simply by delaying the start of the second cycle of the waveform 1010 by one cycle of the reference frequency 1004.

The waveform 1012 is also generated by dividing the 1004 waveform by four, using standard digital techniques, except that the second cycle has been delayed by 180°, with respect to the 0° waveform 1008. The second cycle of waveform 1012 is delayed by 180° simply by delaying the start of the second cycle of the waveform 1012 by two cycles of the reference frequency 1004. The waveform 1014, is also generated by dividing the 1004 waveform by four, using standard digital techniques, except that the second cycle has been delayed by 270° with respect to the 0° waveform 1008. The second cycle of waveform 1014 is delayed by 270° simply by delaying the start of the second cycle of the waveform 1014 by three cycles of the reference frequency 1004.

By using the phase information signal 1002 to select between a delay of 0°, 90°, 180°, or 270°, four symbols may be encoded. Therefore, the Sigma Delta Digital Modulator 1000 may be used to encode QPSK, or any other 4 symbol phase modulation. An output 1016, comprising a quadrature encoded signal 1018, may be produced using the just described Delta Sigma Digital Modulator 1000 and standard digital circuitry. A variety of types of PSK signals may be produced by varying the frequency of the reference signal 1004, the divide value that produces the output signal 1018 from the reference signal 1008, and the number of reference signal 1008 cycles that are inserted in the output signal 1018 as a phase delay.

Figure 11:
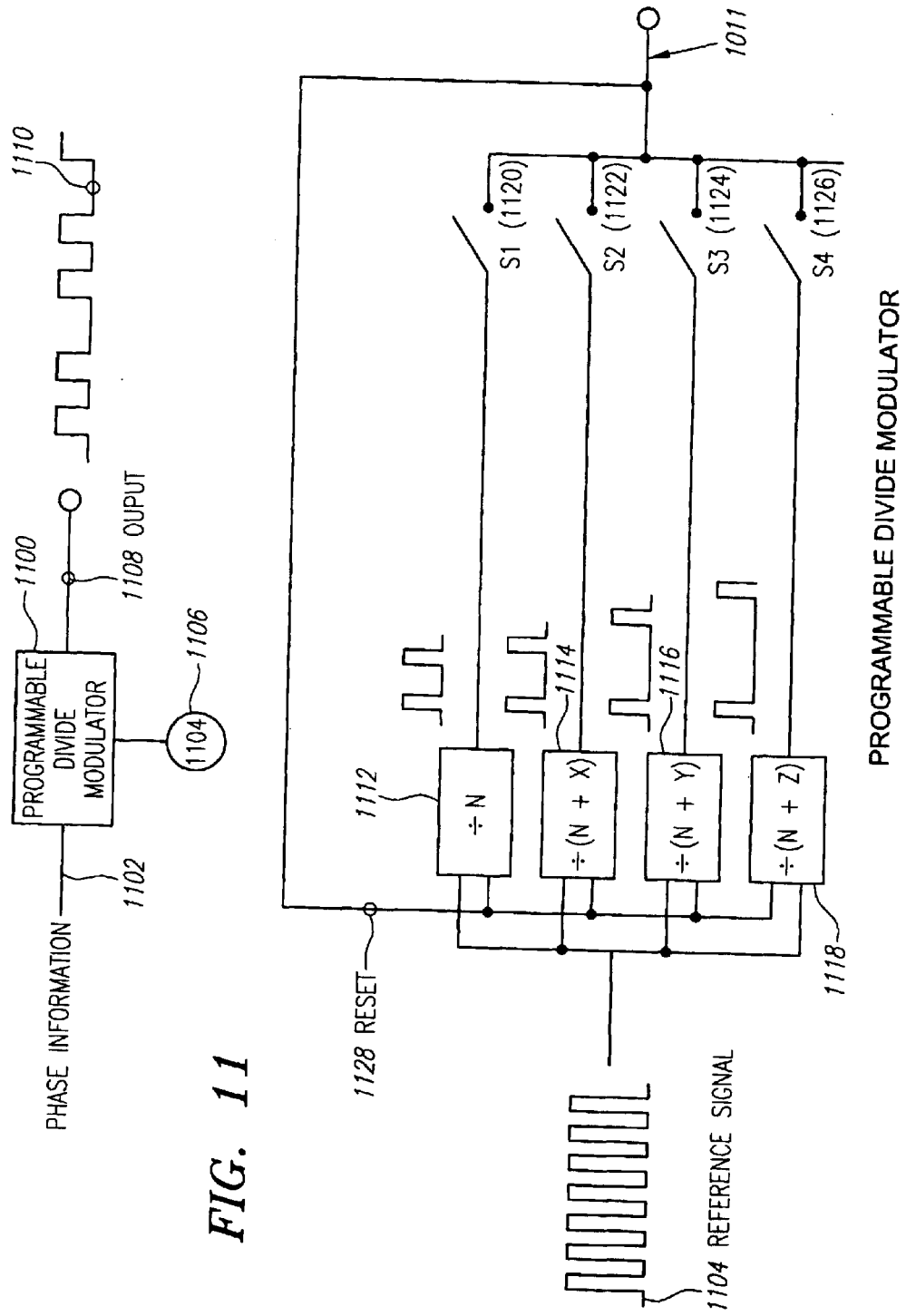
FIG. 11 is a block diagram of a digital programmable divide modulator of the type.

A further embodiment comprising a Digital Phase Modulator is illustrated in FIG. 11. FIG. 11 shows a Programmable Divide Modulator ("PDM") 1100 that produces QPSK signal. Similar principles may be used in the production of any type of PSK signal with minor circuitry variations. The PDM 1100 accepts phase information 1102 and a reference signal 1104 from a reference signal generator 1106. The PDM 1100 produces an output 1108 that comprises a phase modulated signal 1110, by accepting a reference signal 1104 and coupling it into a series of dividers 1112, 1114, 1116 and 1118. Each divider has its own divide ratio different from the other dividers, so the frequencies out of the dividers will all be different. The divide ratio at divider 1112 is smallest and increases at dividers 1114, 1116 and 1118, respectively. In other words N<N+X<N+Y<N+Z.

When the dividers 1112, 1114, 1116 and 1118 are coupled to the same signal source, divider 1112 will be the first to have an output, followed by 1114, 1116 and 1118. By changing the divide ratio, the signal that is produced by divider 1114 has a period that is 90° longer than divider 1112. By changing the divide ratio, the signal that is produced by divider 1116 has a period that is 180° longer than divider 1112. By changing the divide ratio, the signal is produced by of divider 1118 has a period that is 270° longer than divider 1112. This means that the output of 1118 is delayed by 270° with respect to the output of 1112, the output of 1116 is delayed by 180° with respect to the output of 1112, and the output of 1114 is delayed by 90° with respect to the output of 1112.

The phase information 1102 is used to activate S1-(1120), S2-(1122), S3-(1124), or S4-(1126), depending on whether a phase of 0°, 90°, 180°, or 270° is desired. When a pulse, from one of the dividers is actually coupled by the selected switch to the output 1108, the output acts as a reset 1128 to all the counters within the divider circuits (1112, 1114, 1116, and 1118), and the PDM 1100 is then reset and ready to generate the next pulse. The PDM 1100 may be extended to any number of phase delays by changing the reference signal 1104 frequency, adding dividers with the correct divide ratio, and adding selection switches to select between the dividers.

Figure 12:
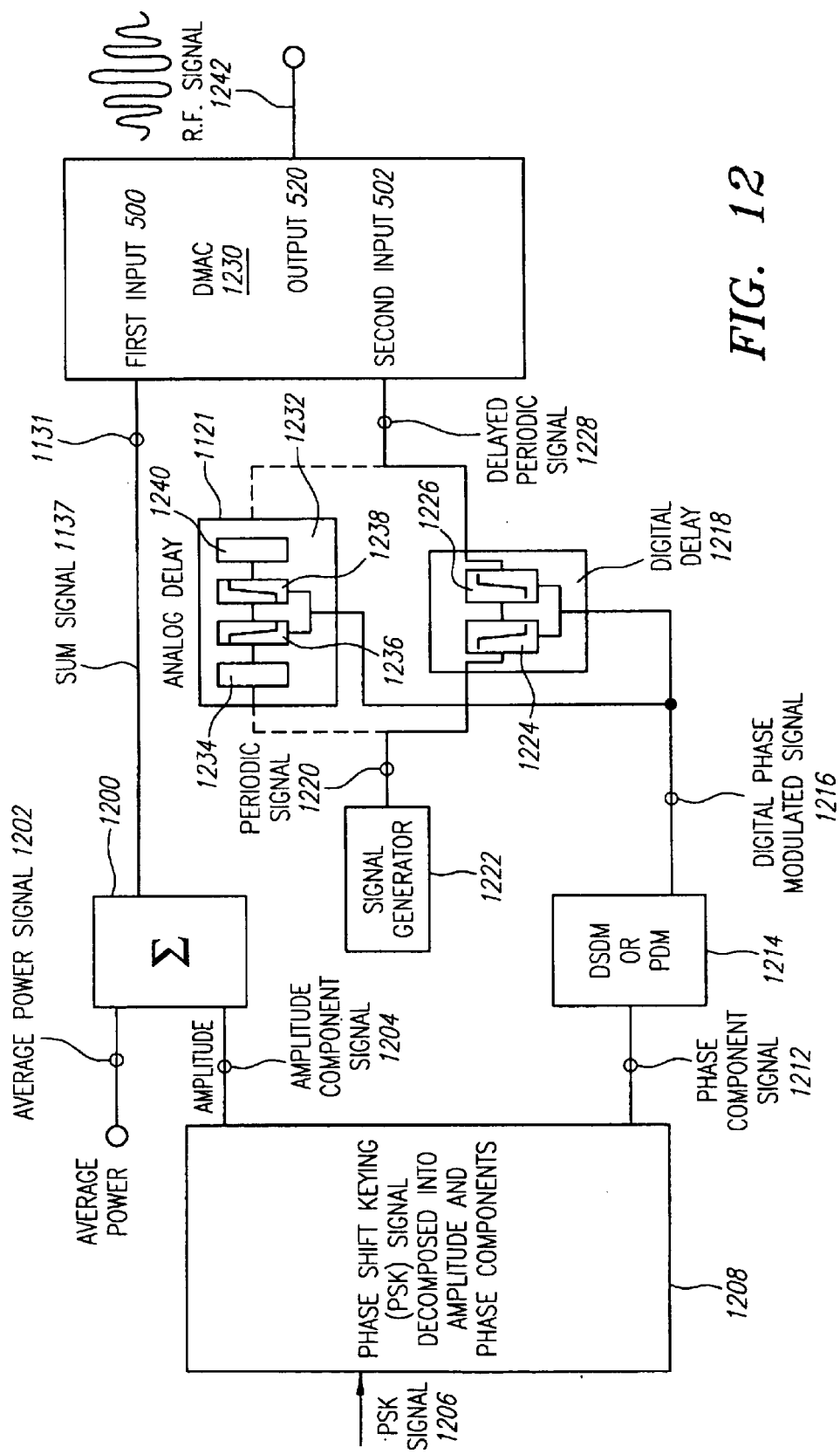
FIG. 12 is a block diagram, of an embodiment of the invention, that includes a digital modulator and a digital output amplifier.

FIG. 12 represents a further embodiment of the invention in that a Digital Amplitude Modulating Circuit ("DAMC"), as illustrated in FIG. 4 that is combined with a Delta Sigma Digital Modulator ("DSDM") or a Programmable Divide Modulator ("PDM"). The connections between the components may be purely digital, analog or mixed. The various embodiments may be combined with digital or analog subsystems, depending on the implementation desired. For example, summation 1200 depicts two inputs, where an average power signal 1202 is coupled to one input and an amplitude component signal 1204 is coupled to the other input. The summation 1200 may be implemented as an operational amplifier summation unit, if the average power signal 1202 and the amplitude component signal 1204 are analog control voltages. The summation 1200 may be implemented as a clocked digital adder unit, if the average power signal 1202 and the amplitude component signal 1204 are digital values. The same is true of the other units illustrated in FIG. 12. The choice of analog or digital control of the blocks within the system is one of implementation only, the basic functioning of the digital blocks will remain unchanged.

A PSK signal 1206 may be decomposed into amplitude and phase components 1208. The decomposition 1208 may be the same type as illustrated in FIG. 7, at block 700. Signal decomposition of PSK signals may be accomplished in a variety of ways, utilizing methods well known in the art. An amplitude component signal 1204 representing the amplitude portion of the PSK signal is then coupled into the summation 1200, where it is summed with the average power signal 1202 to produce a sum signal 1210. The average power signal 1202 is representative of the average broadcast power desired. The sum signal 1210 is then coupled into a first input of a Digital Amplitude Modulating Circuit ("DAMC"). The DAMC may be the same as DAMC of FIG. 4. The average power signal 1202 represents the desired output RF power of the system.

The phase component signal 1212 output from the decomposition 1208 is then used as a control signal for a DSDM 1214 or a PDM 1214. The output 1214 is a digital phase modulated signal 1216, used to control, for example digital delay 1218. Digital delay 1218 is used to delay a periodic signal 1220 from a signal generator 1222. The signal generator 1222 may be an analog generator, such as a sine wave generator, or a digital signal generator that outputs digital numbers equivalent to an analog generator. If the signal generator 1222 is a digital generator, then a digital delay 1218 may be used. In the illustrated embodiment, two registers 1224 and 1226 are coupled back to back. Register 1224 is clocked on the falling edge of a waveform from the DSDM or PDM 1214 and accepts a waveform number from the signal generator when it is clocked on the falling edge of the digital phase modulated signal 1216. The number is then stored in register 1224 until a rising edge of a waveform from the DSDM or PDM 1214 causes the number in register 1224 to be clocked into register 1226. Since the DSDM or PDM 1214 provides a signal that has four different periods representing QPSK values between falling and rising edges, the phase of the signal 1228 produced by signal generator 1222 is variably delayed and then coupled into the amplitude modulation input of a DAMC, such as input 502 of the DMAC of FIG. 5. The DMAC 1230 then produces an output waveform in the same manner as that produced at output 520, in FIG. 5.

If the signal generator 1222 were analog, for example a sine wave generator, an analog delay circuit such as that shown in 1232 may be used. The signal from signal generator 1222 would be coupled into an analog to digital converter 1234. The output of the analog to digital converter 1234 would then be coupled into register 1236 on the falling clock edge of a signal from the DSDM or PDM 1214. The value would then be coupled from register 1236 to register 1238 on the rising edge of a signal from the DSDM or PDM 1214. Since the the DSDM or PDM 1214, provides a signal that has four different periods representing QPSK values between falling and rising edges, the phase of the signal 1228 produced by signal generator 1222 is variably delayed. The output of register 1222 may then be converted into an analog value in the digital to analog converter 1240, and then coupled into the amplitude modulation input, such as 502 in FIG. 5, of a DAMC 1230. In this manner, the entire process of modulation and amplification of a RF signal 1242 may be accomplished with minimal analog components.

While various embodiments of the application have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. An apparatus for digitally producing a modulated signal, comprising:
    an average power input for accepting a first input signal, the first input signal being representative of an average output power to be produced by the apparatus;
    an amplitude modulation input for receiving a second input signal, the second input signal being representative of an amplitude modulation to be produced by the apparatus;
    a summation unit for combining the first input signal with the second input signal and producing a duty cycle control signal, where the duty cycle control signal is proportional to the first input signal and the second input signal;
    a duty cycle controller for accepting the duty cycle control signal and producing an output signal, where the duty cycle of the output signal is proportional to the duty cycle control signal;
    an integrating circuit where the output signal of the duty cycle controller is accepted and integrated, thus producing an integrated output signal; and
    a resonant circuit for accepting the integrated output signal from the integrating circuit and resonating in proportion to the frequency and amplitude of the integrated output signal, to produce a sinusoidal output signal proportional to the integrated output signal from the integrating circuit.

2. An apparatus for digitally producing a modulated RF signal of a predetermined level, comprising:
    a signal decomposition unit for accepting a Phase Shift Keying (PSK) signal and decomposing the PSK signal into a phase component signal, and an amplitude component signal;
    a digital phase modulation unit for accepting the phase component signal and producing a digital phase modulated signal;
    a signal generator for providing a periodic signal;
    a delay unit with a first input for accepting the digital phase modulated signal, and a second input for accepting the periodic signal, and producing a delay in the periodic signal proportional to the digital phase modulated signal thus producing a delayed periodic signal in that the delay is proportional to the digital phase modulated signal;
    a summation unit, having a first input for accepting an average power signal, and having a second input for accepting the amplitude component signal, whereby the average power signal is combined with the amplitude component signal and whereby a sum signal proportional to the average power signal and also proportional to the amplitude component signal is produced; and
    a Digital Amplitude Modulating Circuit ("DAMC") for accepting the delayed periodic signal and accepting the sum signal and producing the modulated radio frequency (RF) signal.

3. The apparatus of claim 2, wherein the digital phase modulation unit comprises a Delta Sigma Digital Modulator ("DSDM").

4. The apparatus of claim 2, wherein the digital phase modulation unit comprises a Programmable Divide Modulator ("PDM").

5. The apparatus of claim 2, wherein the delay unit comprises a digital delay unit.

6. The apparatus of claim 2, wherein the delay unit comprises an analog delay unit.

7. A method for digitally producing a modulated signal, comprising:

accepting a first input signal representative of a desired average output power;

accepting a second input signal representative of a desired amplitude modulation;

combining the first input signal with the second input signal and producing a duty cycle control signal, where the duty cycle control signal is proportional to the first input signal and the second input signal;

accepting the duty cycle control signal and producing an output signal, where the duty cycle of the output signal is proportional to the duty cycle control signal;

integrating the output signal thus producing an integrated output signal; and coupling the integrated output signal in a resonant circuit, thus producing a sinusoidal output signal proportional to the integrated output signal.

8. A method for digitally producing a modulated RF signal of a predetermined level, comprising:

decomposing a PSK signal into a phase component signal and an amplitude component signal;

producing a digital phase modulated signal from the phase component signal;

providing a periodic signal;

producing a delay in the periodic signal proportional to the digital phase modulated signal, thus producing a delayed periodic signal where the delay is proportional to the digital phase modulated signal;

combining an average power signal with the amplitude component signal and producing a sum signal proportional to the average power signal and also proportional to the amplitude component signal; and coupling the delayed periodic signal and the sum signal into a Digital Amplitude Modulating Circuit ("DAMC") thus producing the modulated radio frequency (RF) signal.

9. The method of claim 8, wherein the step of producing a digital phase modulated signal comprises using a Delta Sigma Digital Modulator ("DSDM") to produce the digital phase modulated signal.

10. The method of claim 8, wherein the step of producing a digital phase modulated signal comprises using a Programmable Divide Modulator ("PDM") to produce the digital phase modulated signal.

11. The method of claim 8, wherein the step of producing a delay in the periodic signal comprises delaying the periodic signal using a digital delay unit.

12. The method of claim 8, wherein the step of producing a delay in the period signal comprises delaying the periodic signal using an analog delay unit.

13. An apparatus for digitally producing a modulated signal, comprising:

means for accepting a first input signal, the first input signal being representative of a desired average output power;

means for receiving a second input signal, the second input signal being representative of a desired amplitude modulation;

means for combining the first input signal with the second input signal and producing a duty cycle control signal, where the duty cycle control signal is proportional to the first input signal and the second input signal;

means for accepting the duty cycle control signal and producing an output signal, where the duty cycle of the output signal is proportional to the duty cycle control signal;

means for integrating the output signal to produce an integrated output signal; and means for producing a sinusoidal output signal proportional to the integrated output signal.

14. An apparatus for digitally producing a modulated RF signal of a predetermined level, comprising:

means for decomposing a PSK signal into a phase component signal and an amplitude component signal;

means for producing a digital phase modulated signal from the phase component signal;

means for providing a periodic signal;

means for producing a delay in the periodic signal proportional to the digital phase modulated signal, thus producing a delayed periodic signal where the delay is proportional to the digital phase modulated signal;

means for combining an average power signal with the amplitude component signal and producing a sum signal proportional to the average power signal and also proportional to the amplitude component signal; and means for coupling the delayed periodic signal and the sum signal into a Digital Amplitude Modulating Circuit ("DAMC") thus producing the modulated radio frequency (RF) signal.

15. The apparatus of claim 14, wherein the means for producing a digital phase modulated signal comprises a Delta Sigma Digital Modulator ("DSDM").

16. The apparatus of claim 14, wherein the means for producing a digital phase modulated signal comprises a Programmable Divide Modulator ("PDM").

17. The apparatus of claim 14, wherein the means for producing a delay in the periodic signal comprises at least one digital delay unit.

18. The apparatus of claim 14, wherein the means for producing a delay in the periodic signal comprises an analog delay unit.

* * * * *